United States Patent
Venugopal et al.

(10) Patent No.: US 9,064,562 B2
(45) Date of Patent: Jun. 23, 2015

(54) MEMORY MODULE HAVING MULTIPLE MEMORY BANKS SELECTIVELY CONNECTABLE TO A LOCAL MEMORY CONTROLLER AND AN EXTERNAL MEMORY CONTROLLER

(71) Applicant: Hewlett-Packard Development Company, L.P., Houston, TX (US)

(72) Inventors: Raghavan V. Venugopal, Spring, TX (US); William C. Hallowell, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 181 days.

(21) Appl. No.: 13/856,013

(22) Filed: Apr. 3, 2013

(65) Prior Publication Data
US 2014/0304462 A1 Oct. 9, 2014

(51) Int. Cl.
- *G06F 12/00* (2006.01)
- *G11C 16/00* (2006.01)
- *G06F 13/16* (2006.01)
- *G06F 13/00* (2006.01)
- *G06F 13/28* (2006.01)

(52) U.S. Cl.
CPC .............. *G11C 16/00* (2013.01); *G06F 12/00* (2013.01); *G06F 13/16* (2013.01)

(58) Field of Classification Search
CPC ... G06F 12/00; G06F 2212/286; G06F 13/16; G11C 16/00
USPC ................ 711/5, 115, 162; 370/382
See application file for complete search history.

(56) References Cited

U.S. PATENT DOCUMENTS

| | | | |
|---|---|---|---|
| 5,146,431 A * | 9/1992 | Eby et al. | 365/238.5 |
| 5,854,638 A | 12/1998 | Tung | |
| 5,893,158 A | 4/1999 | Furuta | |
| 6,587,391 B2 | 7/2003 | Jung | |
| 7,024,518 B2 | 4/2006 | Halbert et al. | |
| 7,194,577 B2 | 3/2007 | Johnson | |
| 7,640,386 B2 | 12/2009 | Coteus et al. | |
| 7,853,837 B2 * | 12/2010 | Perego et al. | 714/704 |
| 8,037,234 B2 | 10/2011 | Yu et al. | |
| 8,108,590 B2 | 1/2012 | Chow et al. | |
| 8,281,101 B2 | 10/2012 | Bains | |
| 2003/0147297 A1 | 8/2003 | Shiota et al. | |
| 2004/0264286 A1 * | 12/2004 | Ware et al. | 365/232 |

(Continued)

FOREIGN PATENT DOCUMENTS

| | | |
|---|---|---|
| EP | 0717358 | 6/1996 |
| JP | 2005141420 | 6/2005 |

OTHER PUBLICATIONS

ISR/WO, PCT/US2012/044696. HP reference 83014383. Feb. 14, 2013. 10 pps.

(Continued)

*Primary Examiner* — Mark Giardino, Jr.
(74) *Attorney, Agent, or Firm* — Trop, Pruner & Hu, P.C.

(57) ABSTRACT

A memory module includes memory banks, a local memory controller to access data in the memory banks, and an interface to an external memory controller that is configured to access the memory module. Multiplexing circuitry selectively connects the memory banks to the local memory controller and to the interface to the external memory controller.

19 Claims, 3 Drawing Sheets

(56) References Cited

U.S. PATENT DOCUMENTS

| | | |
|---|---|---|
| 2007/0025173 A1* | 2/2007 | Cullum et al. ............ 365/230.03 |
| 2008/0046638 A1 | 2/2008 | Maheshwari et al. |
| 2008/0266988 A1 | 10/2008 | Sohn et al. |
| 2008/0320204 A1 | 12/2008 | Jo et al. |
| 2009/0031098 A1* | 1/2009 | Sartore ......................... 711/162 |
| 2009/0094391 A1 | 4/2009 | Yim |
| 2009/0172271 A1 | 7/2009 | Bains |
| 2009/0313416 A1 | 12/2009 | Nation |
| 2010/0023682 A1 | 1/2010 | Lee et al. |
| 2010/0036997 A1 | 2/2010 | Brewer et al. |
| 2010/0110748 A1 | 5/2010 | Best |
| 2010/0325352 A1 | 12/2010 | Schuette et al. |

OTHER PUBLICATIONS

Mutlu et al., Microsoft Research, Parallelism-Aware Batch Scheduling: Enhancing both Performance and Fairness of Shared DRAM Systems, Jun. 2008 (12 pages).

Carpenter et al., International Appl. No. PCT/US12/35913 entitled Prearranging Data to Commit to Non-Volatile Memory filed May 1, 2012 (22 pages).

Korean Intellectual Property Office, International Search Report and Written Opinion for PCT/US2012/035913 dated Feb. 7, 2013 (8 pages).

Vincent Nguyen et al., International Appl. No. PCT/US13/23743 entitled Runtime Backup of Data in a Memory Module filed Jan. 30, 2013 (23 pages).

\* cited by examiner

MEMORY MODULE HAVING MULTIPLE MEMORY BANKS SELECTIVELY CONNECTABLE TO A LOCAL MEMORY CONTROLLER AND AN EXTERNAL MEMORY CONTROLLER

BACKGROUND

A system can include various types of storage devices, including a persistent secondary storage (e.g. disk-based storage or solid-state storage) and an intermediate storage. The intermediate storage can be implemented with a higher-speed storage device than used with the persistent secondary storage. Examples of storage devices that can be used in the intermediate storage include dynamic random access memories (DRAMs), static random access memories (SRAMs), flash memories, and so forth.

BRIEF DESCRIPTION OF THE DRAWINGS

Some embodiments are described with respect to the following figures.

DETAILED DESCRIPTION

A system (e.g. a desktop computer, a notebook computer, a tablet computer, a personal digital assistant, a smartphone, etc.) can include a memory module that has both volatile memory and non-volatile memory. Volatile memory includes memory that loses its data content in case power is removed from the volatile memory. A non-volatile memory, on the other hand, maintains its data content even if power is removed from the non-volatile memory.

The volatile memory can be implemented with dynamic random access memory (DRAM) devices, static random access memory (SRAM) devices, or other types of devices. The non-volatile memory can be implemented with flash memory devices, phase change memory devices, memristor memory devices, or other types of devices.

An example of a memory module that includes both volatile storage and non-volatile storage is a non-volatile dual in-line memory module (NV-DIMM). An NV-DIMM can include one or multiple DRAM devices, and one or multiple flash memory devices, as examples. Although reference is made to an NV-DIMM, it is noted that in other examples, other types of memory modules that include volatile storage and non-volatile storage can be used.

The memory module can also include a local memory controller that is able to access data stored in the volatile memory or non-volatile memory of the memory module. In addition, the memory module can be accessed by an external memory controller that is part of the host system. For example, the external memory controller may be able to access data in the volatile memory of the memory module.

While the local memory controller is accessing the memory module, it may be possible that the external memory controller may attempt to access the memory module at that time. If the memory module does not respond to the memory request from the external memory controller within a specified time interval and with the expected signal timings (which can be defined by a standard governing the operation of a memory bus between the memory controller and a memory device), then that can result in a failure condition that can cause the host system to behave in an unexpected way. A standard that governs operations on a memory bus can be defined by the Joint Electronic Devices Engineering Council (JEDEC), in some examples.

In some examples, failure to respond to a memory request from the external memory controller within a specified time interval and with the expected signal timings, can be considered a hardware failure, which can cause the host system to crash or to behave in an expected way.

Figure 1:
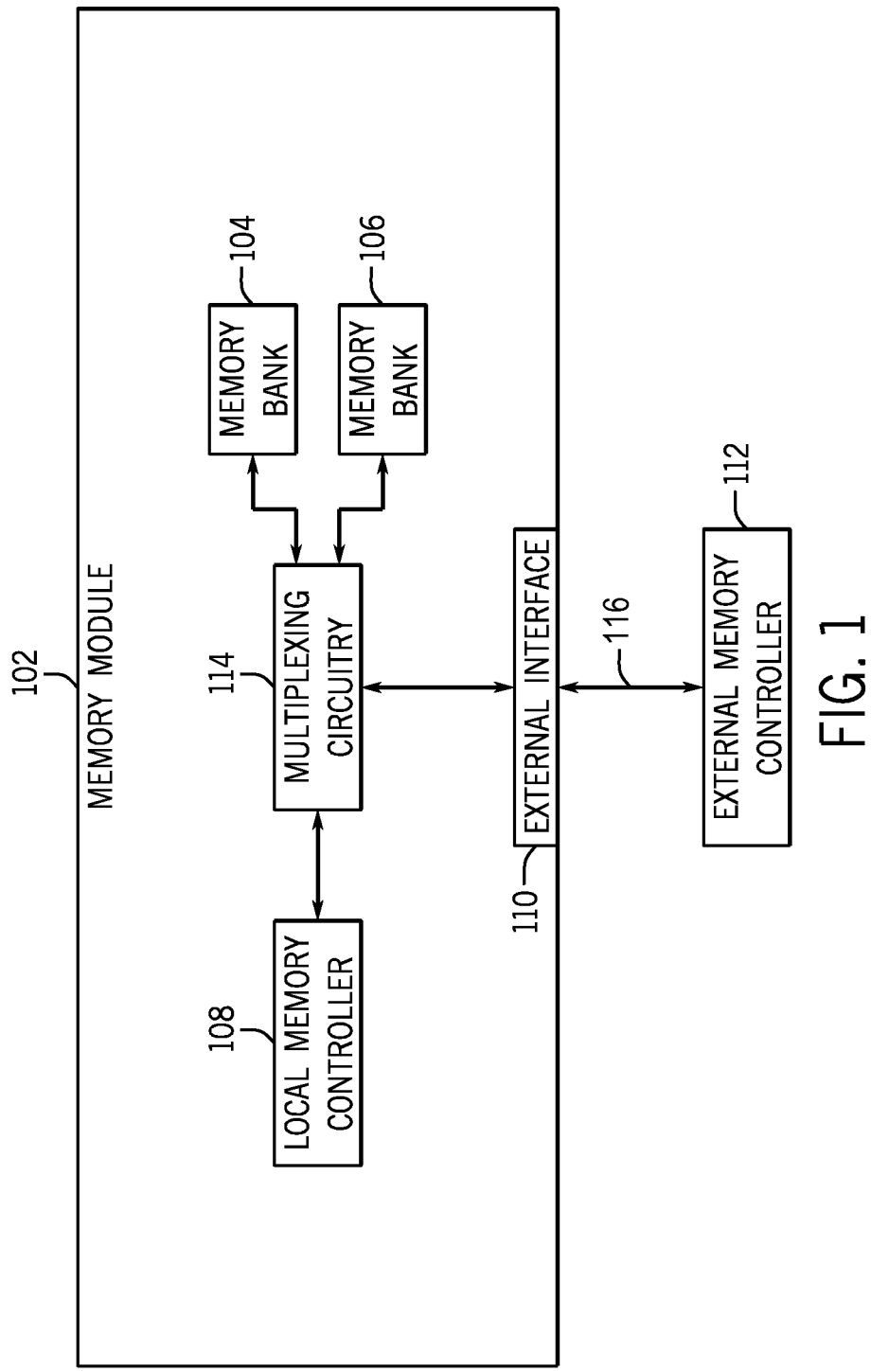
FIG. 1 is a block diagram of an example arrangement that includes a memory module according to some implementations.

In accordance with some implementations, as shown in FIG. 1, a memory module 102 includes multiple memory banks 104 and 106. Although just two memory banks are depicted in FIG. 1, the memory module 102 can include a greater number of memory banks in other examples. A memory bank can refer to a segment of memory, where a memory bank can include one or multiple memory devices. Alternatively, a memory bank can include a portion of a memory device or a portion of multiple memory devices. In some examples, the memory banks 104 and 106 can each include volatile memory.

The memory module 102 also includes a local memory controller 108, which is able to access data in the memory banks 104 and 106. The memory module 102 additionally includes an external interface 110, which is connected to an external memory controller 112 over a memory bus 116.

The memory module 102 also includes multiplexing circuitry 114 to selectively connect the memory banks 104 and 106 to the local memory controller 108 and to the external interface 110, which is connected to the external memory controller 112. The multiplexing circuitry 114 can selectively connect both the memory banks 104, 106 to the local memory controller 108, or to connect both the memory banks 104, 106 to the external interface 110. Alternatively, the multiplexing circuitry 114 can selectively connect a first one of the memory banks 104, 106 to the local memory controller 108, and selectively connect a second one of the memory banks 104, 106 to the external interface 110.

When a given memory bank is connected by the multiplexing circuitry 114 to the local memory controller 108, the given memory bank is isolated from the external interface 110, such that the external memory controller 112 would not be able to access the given memory bank. More specifically, if the memory bank 104 is connected by the multiplexing circuitry 114 to the local memory controller 108, then the memory bank 104 is isolated from the external interface 110 by the multiplexing circuitry 114. The local memory controller 108 is able to access the memory bank 104, but the external memory controller 112 is not able to access the memory bank 104.

Similarly, when a given memory bank is connected by the multiplexing circuitry 114 to the external interface 110, the given memory bank is isolated from the local memory controller 108, such that the local memory controller 108 would not be able to access the given memory bank.

During run-time of a host system that includes the external memory controller 112 and the memory module 102, at least one of the memory banks 104 and 106 is connected by the multiplexing circuitry 114 to the external interface 110, if the host system determines the host system is in a mode where the external memory controller 112 may attempt to access the memory module 102. In this manner, when the external memory controller 112 issues a memory request over the memory bus 116 to the memory module 102 for data stored by the memory module 102, the memory bank that is connected by the multiplexing circuitry 114 to the external interface 110 is able to respond to the memory request. The response includes signals that are driven within a specified time interval and according to timings specified by a standard governing operation over the memory bus 116. In this way, some response conforming to the memory bus standard is provided to the external memory controller 112 in response to the memory request, which avoids the condition where no response is provided by the memory module 102 to the external memory controller 112, which can lead to an indeterminate reaction by the system.

In some cases, the responding memory bank may not actually be the memory bank that is the subject of the memory request from the external memory controller 112. As a result, data provided by the responding memory bank may be incorrect data (in other words, data that is not data that is sought by the memory request). However, the provision of the incorrect data can be handled by the host system, such as by machine-readable instructions executing in the host system. In some examples, a data error may be indicated, which can trigger a retry of the memory request to the memory module 102.

In other implementations, data in one memory bank is shadowed (copied) in the other memory bank, such that duplicate copies of data can be stored in the memory banks 104 and 106. In the shadow mode, a write to the memory module 102 causes the same data to be written to both memory banks 104, 106. In this manner, a memory request submitted by the external memory controller 112 for a first memory bank can be correctly satisfied from the duplicate copy of data in the second memory bank.

Figure 2:
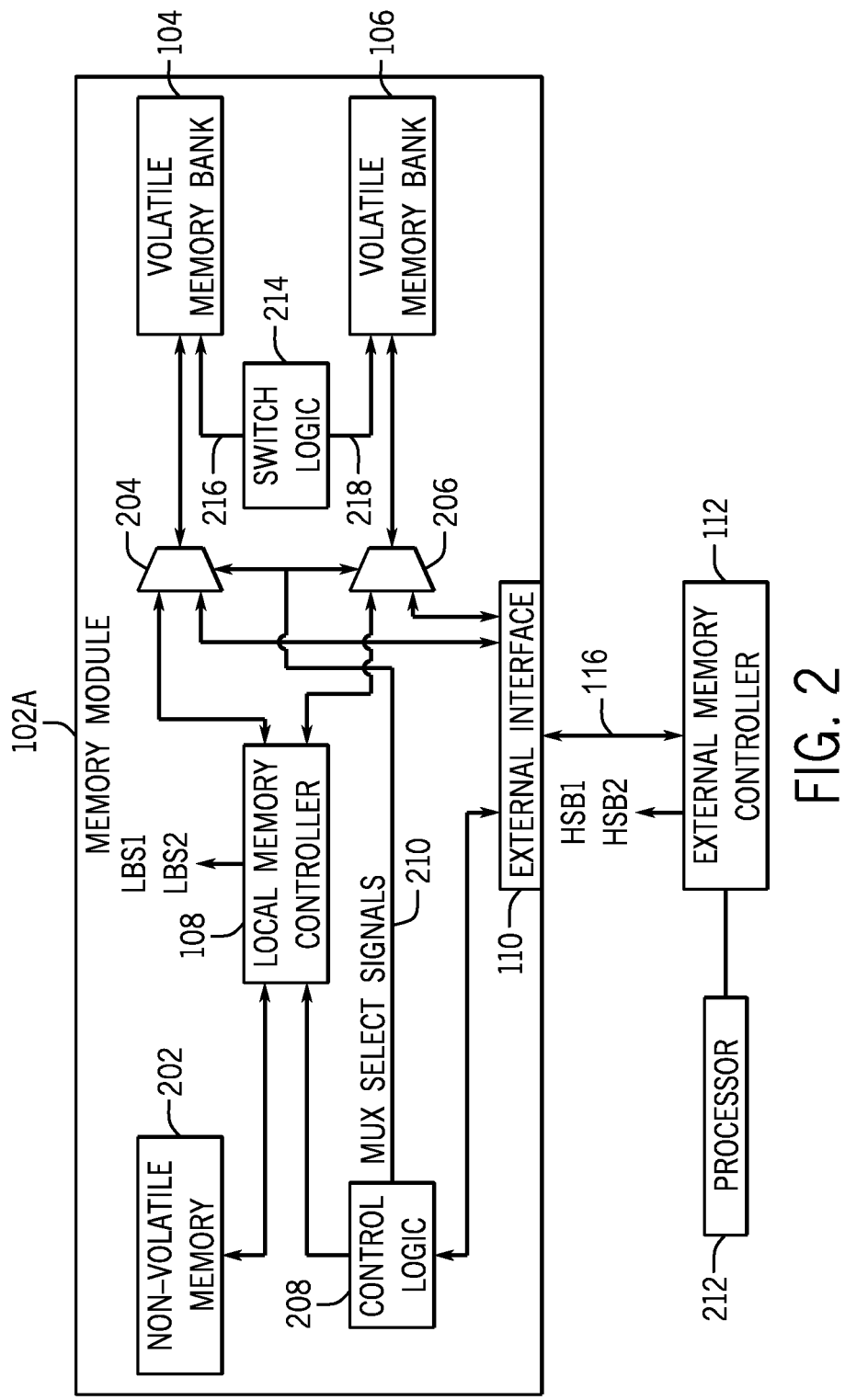
FIG. 2 is a block diagram of another example arrangement that includes a memory module according to further implementations.

FIG. 2 is a block diagram of another example arrangement that includes a memory module 102A according to further implementations. The memory module 102A includes volatile memory banks 104 and 106, as well as a non-volatile memory 202. In FIG. 2, the multiplexing circuitry 114 of FIG. 1 is implemented as multiplexers/demultiplexers 204 and 206. A multiplexer receives multiple inputs, and based on a select signal, selects one of the multiple inputs for output. A demultiplexer receives an input, and outputs the input to one of multiple outputs based on a select signal.

The local memory controller 108 is selectively connected to the volatile memory banks 104 and 106 by the multiplexer/demultiplexer 204 and the multiplexer/demultiplexer 206. The multiplexer/demultiplexer 204 can select one of the local memory controller 108 and external interface 110 to connect to the volatile memory bank 104. Similarly, the multiplexer/demultiplexer 206 can select one of the local memory controller 108 and the external interface 110 to connect to the volatile memory bank 106.

In some examples, the local memory controller 108 is also able to access the data in the non-volatile memory 202. In other examples, a separate memory controller can be included in the memory module 102A for managing access of data in the non-volatile memory 202. In some implementations, the non-volatile memory 202 is used as a backup storage device to back up data in the volatile memory bank 104 and/or volatile memory bank 106. Performing a backup of data from a volatile memory bank to the non-volatile memory 202 can include copying the data to the non-volatile memory 202, such that the data resides in both the non-volatile memory 202 and the volatile memory bank. Alternatively, backing up data from a volatile memory bank to the non-volatile memory 202 can involve moving the data to the non-volatile memory 202, such that the data no longer resides at the volatile memory bank.

In other examples, instead of or in addition to the non-volatile memory 202, the memory module 102A can include a communications interface to allow the memory module 102A to connect to another processor or computer, such as over a bus or a network. The local memory controller 108 or another controller in the memory module 102A can communicate with the other processor or computer through the communications interface.

The memory module 102A further includes control logic 208, which can be implemented with a processing circuit, such as a microcontroller, microprocessor, application programming interface circuit (ASIC), programmable gate array (PGA), and so forth.

The control logic 208 outputs MUX select signals 210 to control the multiplexers/demultiplexers 204 and 206. Based on the states of the MUX select signals, the multiplexers/demultiplexers 204 and 206 can selectively connect the local memory controller 108 and external interface 110 to the volatile memory banks 104 and 106.

The control logic 208 is coupled to the external interface 110. The control logic 208 can be provided with command information to cause the control logic 208 to control the multiplexer/demultiplexers 204 and 206 to selectively connect the local memory controller 108 and the external interface 110 to the volatile memory banks 104 and 106. In some examples, the command information can be provided by machine-readable instructions executing on a processor 212 of the system. The processor 212 can be connected to the external memory controller 112.

The memory module 102A further includes switch logic 214, which outputs bank select signals 216 and 218 to the volatile memory banks 104 and 106. A bank select signal if asserted to an active state causes activation of the respective volatile memory bank. For example, if the bank select signal 216 is activated, then the volatile memory bank 104 is selected.

The local memory controller 108 outputs a first bank select signal (LBS1) and a second bank select signal (LSB2), which are connected to inputs of the switch logic 214. Similarly, the external memory controller 112 outputs a first bank select signal (HBS1) and a second bank select signal (HSB2) that are provided through the external interface 110 to inputs of the switch logic 214. The switch logic 214 is controlled by control signals from the control logic 208, which control which of LBS1, LBS2, HBS1, and HBS2 are connected to the bank select signals 216 and 218.

In some examples, the table below shows how the bank select signals from the local memory controller 108 and the external memory controller 112 are connected in different modes. In the table below, "NC" stands for "no connection," which means that the respective bank select signal from the local or external memory controller is not connected to either 216 or 218.

| Mode | Switch Logic | Connections |
| --- | --- | --- |
| Default | HBS1→216 | LBS1→NC |
|  | HBS2→218 | LBS1→NC |
| Local To | HBS1→218 | LBS1→216 |
| Bank 1 | HBS2→218 | LBS2→NC |
| Local To | HBS1→216 | LBS1→NC |
| Bank 2 | HBS2→216 | LBS2→218 |
| Backup | HBS1→NC | LBS1→216 |
|  | HBS2→NC | LBS2→218 |
| Shadow | HBS1→216 | LBS1→NC |
|  | HBS1→218 | LBS1→NC |

The table above shows a Default mode of operation, which can be the mode normally used during run-time of the host system. In the Default mode, both volatile memory banks 104 and 106 are to be connected to the external memory controller 112 (which means that the local memory controller 108 is isolated from the volatile memory banks 104 and 106). In the Default mode, the bank select signals HSB1 and HSB2 from the external memory controller 112 are connected by the switch logic 214 to respective ones of the bank select signals 216 and 218. The bank select signals LSB1 and LSB2 from the local memory controller 108 are not connected to either of the bank select signals 216 and 218.

Similarly, if both volatile memory banks 104 and 106 are to be connected to the local memory controller 108 (which means that the volatile memory banks 104 and 106 are isolated from the external memory controller 112), then the bank select signals LSB1 and LSB2 from the local memory controller 108 would be connected by the switch logic 214 to the respective bank select signals 216 and 218. This can occur in a Backup mode, as depicted in the table above. In the Backup mode, data from both volatile memory banks 104 and 106 are being backed up to the local memory controller 108. The host system 108 can enter the Backup mode (by sending the corresponding control information to the control logic 208) when the host system 108 has taken steps to ensure that the external memory controller 112 is quiesced such that it would not access the memory bus 116.

The table above also lists a Local to Bank 1 mode, in which the volatile memory bank 104 is connected to the local memory controller 108, and the volatile memory bank 106 is connected to the external interface 110. In this mode, the bank select signal LBS1 from the local memory controller 108 is connected to the bank select signal 216, while the bank select signal LBS2 from the local memory controller 108 is not connected. However, in this mode, both bank select signals HBS1 and HBS2 from the external memory controller 112 are connected to the bank select signal 218 to the volatile memory bank 106. This ensures that a memory request from the external memory controller 112 to either the volatile memory bank 104 or the volatile memory bank 106 would be responded to by the volatile memory bank 106.

Another mode depicted in the table above is a Local to Bank 2 mode, in which a volatile memory bank 106 is connected to the local memory controller 108, and the volatile memory bank 104 is connected to the external interface 110. In this mode, the bank select signal LBS1 from the local memory controller 108 is not connected, and the bank select signal LBS2 from the local memory controller 108 is connected by the switch logic 214 to the volatile memory bank 106. However, both bank select signals HBS1 and HBS2 from the external memory controller 112 are connected by the switch logic 214 to the bank select signal 216, which ensures that any memory request from the external memory controller 112 for either the volatile memory bank 104 or the volatile memory bank 106 would be responded to by the volatile memory bank 104.

Another mode listed in the table above is a Shadow mode, where a write of data to the memory module 102A results in the same data being written to both volatile memory banks 104 and 106. While in Shadow mode, care should be taken to not read from the memory module 102A as both volatile memory banks will try to respond.

The different modes can be specified by provision of control information to the control logic 208 in the memory module 102A. For example, machine-readable instructions executing on the processor 212 can program the control logic 208 to the selected mode.

In some implementations, when the host system initially starts up, the control logic 208 can be configured (by the host system) to cause both the volatile memory banks 104 and 106 to be connected to the external interface 110, which corresponds to the Default mode in the table above. After initialization of the memory module 102A, the control logic 208 can be configured to allow one of the volatile memory banks 104 and 106 to be connected to the local memory controller 108, while the other one of the volatile memory banks 104 and 106 is connected to the external interface 110. On the next idle phase of the memory bus 116, the control logic 108 can switch the multiplexer/demultiplexers 204 and 206 to connect one of the volatile memory banks 104 and 106 to the local memory controller 108. In one example, the external memory controller 112 continues to have access to the other volatile memory bank. This configuration corresponds to either the Local to Bank 1 or Local to Bank 2 mode in the table above.

While the local memory controller 108 is connected to one of the volatile memory banks, the local memory controller 108 can perform a backup operation to back up data from the connected volatile memory bank to the non-volatile memory 202, according to some implementations.

Whenever a volatile memory bank is switched to connect to the local memory controller 108, the local memory controller 108 can configure the connected volatile memory bank to operate at a configuration supported by the local memory controller 108. The configuration can include an operating speed and/or other configuration associated with the local memory controller 108. Also, in examples where the volatile memory banks include DRAMs, the local memory controller 108 can generate refresh cycles at the rate specified for the connected volatile memory bank to ensure that the DRAM remains refreshed. A DRAM stores data in capacitive memory cells that can lose their charge over time. Refreshing the DRAM results in restoring the stored capacitive charge of the memory cells.

When the control logic 208 next switches connection of a volatile memory bank back from the local memory controller to the external interface 110, which can be indicated by the control logic 208 to the local memory controller 108, the local memory controller 108 can change the configuration of the volatile memory bank back to the configuration (e.g. operating speed and/or other configuration) supported by the external memory controller 112. Also, prior to switching back the connection to the external memory controller 112, the local memory controller 108 can perform a sufficient number of refresh cycles to ensure that the external memory controller 112 has an adequate amount of time to take over control of the volatile memory bank that is being switched from the local memory controller 108 to the external memory controller 112.

In one example, priority can be given to the external memory controller 112 in decisions regarding whether to connect a volatile memory bank to the local memory controller 108 or the external interface 110. A detection mechanism can be provided to determine whether the memory bus 116 is idle before the control logic 208 is allowed to switch the connection of a volatile memory bank to the local memory controller 108. This detection mechanism can be included in the external interface 110, for example.

Figure 3:
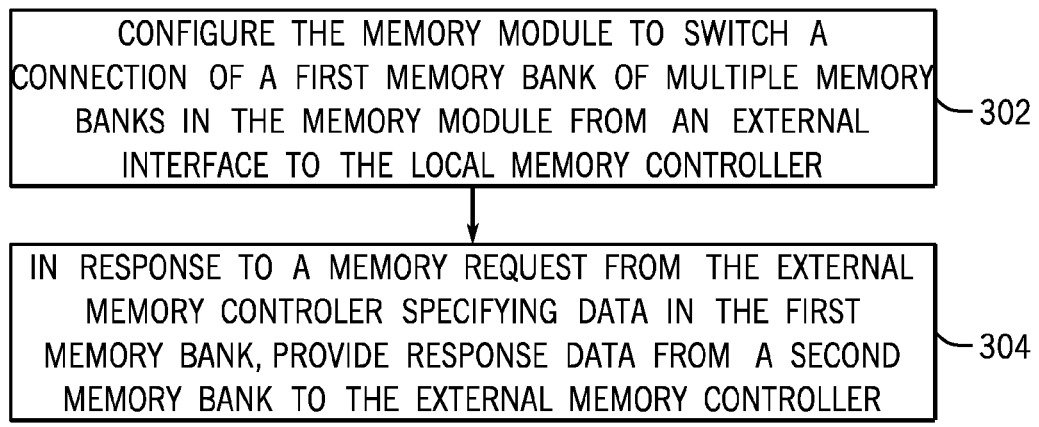
FIG. 3 is a flow diagram of a memory access process according to some implementations.

FIG. 3 is a flow diagram of a memory access process according to some implementations. The host system configures (at 302) the memory module 102 or 102A to switch a connection of a first memory bank of multiple memory banks in the memory module from the external interface 110 to the local memory controller 108 in the memory module. As discussed above, the configuring includes controlling the multiplexing circuitry 114 of FIG. 1 or the multiplexers/demultiplexers 204, 206 of FIG. 2 in the memory module to perform the switch.

In response to a memory request from the external memory controller 112 specifying data in the first memory bank, response data is provided (at 304) from a second of the multiple memory banks to the external memory controller 112.

Various tasks described above can be performed by hardware circuitry. Alternatively, some tasks can be performed by machine-readable instructions executable on a processing circuit.

Data and instructions are stored in respective storage devices, which are implemented as one or multiple computer-readable or machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A memory module comprising:
   memory banks;
   a local memory controller to access data in the memory banks;
   an interface to an external memory controller that is configured to access the memory module; and
   multiplexing circuitry to selectively connect the memory banks to the local memory controller and to the interface to the external memory controller, wherein
   in a configuration when the multiplexing circuitry connects a first one of the memory banks to the local memory controller, the multiplexing circuitry isolates the first memory bank from the interface to the external memory controller, and
   the multiplexing circuitry is to connect, in another configuration, a second one of the memory banks to the interface to the external memory controller while connecting the first memory bank to the local memory controller.

2. The memory module of claim 1, wherein a second one of the memory banks is to respond to a memory request from the external memory controller, wherein the memory request specifies access to data of the first memory bank that is isolated from the external memory controller.

3. The memory module of claim 2, wherein data returned by the second memory bank in response to the memory request for access of the first memory bank is incorrect data from the second memory bank that is not the data requested of the first memory bank in the memory request, and the incorrect data is handled by a host system associated with the external memory controller.

4. The memory module of claim 2, wherein the second memory bank stores a copy of data in the first memory bank, and wherein the data returned by the second memory bank in response to the memory request is from the copy of data.

5. The memory module of claim 1, wherein each of the memory banks includes volatile memory, wherein the memory module further comprises a non-volatile memory, the local memory controller to perform backup of data in at least one of the memory banks to the non-volatile memory.

6. The memory module of claim 1, further comprising control logic to control the multiplexing circuitry to selectively connect the memory banks to the local memory controller and to the interface to the external memory controller.

7. The memory module of claim 6, wherein the control logic is to control the multiplexing circuitry in response to command information from a processor that is external of the memory module.

8. The memory module of claim 6, wherein the control logic is selectively programmable by control information to one of a plurality of modes, the plurality of modes including:
   a first mode in which the memory banks are each connected by the multiplexing circuitry to the local memory controller;
   a second mode in which one of the memory banks is connected by the multiplexing circuitry to the local memory controller, and another of the memory banks is connected by the multiplexing circuitry to the interface to the external memory controller; and
   a third mode in which the memory banks are each connected by the multiplexing circuitry to the interface to the external memory controller.

9. The memory module of claim 1, wherein the local memory controller is to configure an operating speed of the memory banks to an operating speed compatible with whichever one of the local memory controller or the external memory controller the memory banks are selectively connected by the multiplexing circuitry.

10. A method comprising:
    configuring a memory module to switch a connection of a first memory bank of multiple memory banks in the memory module from an external interface of the memory module to a local memory controller in the memory module, wherein the external interface is connected to an external memory controller, wherein the configuring includes controlling multiplexing circuitry of the memory module to perform the switch, the multiplexing circuitry to selectively connect the memory banks to the local memory controller and to the interface to the external memory controller; and
    in response to a memory request from the external memory controller specifying data in the first memory bank when the first memory bank is connected to the local memory controller and is isolated from the external memory controller by the multiplexing circuitry, providing response data from a second memory bank of the multiple memory banks to the external memory controller.

11. The method of claim 10, further comprising:
during initialization of a host system, configuring the memory module to connect each of the multiple memory banks to the external interface.

12. The method of claim 11, further comprising:
after the initialization of the host system, performing the configuring to switch the first memory bank from the external interface of the memory module to the local memory controller, while the second memory bank is connected to the external interface.

13. The method of claim 10, further comprising:
performing backup of data from the first memory bank to a non-volatile memory in the memory module.

14. The method of claim 13, further comprising:
concurrent with the backup, accessing another of the multiple memory banks by the external memory controller.

15. The method of claim 10, further comprising:
switching the memory module to a shadow mode in which each of the multiple memory banks is connected to the external interface; and
in response to a write request, write a same data to each of the multiple memory banks.

16. The method of claim 10, wherein the configuring includes providing control information from a source external of the memory module to control logic in the memory module.

17. A system comprising:
an external memory controller; and
a memory module connected over a memory bus to the external memory controller, the memory module comprising:
memory banks;
a local memory controller to access data in the memory banks;
an external interface connected to the memory bus; and
multiplexing circuitry to selectively connect the memory banks to the local memory controller and to the external interface,
wherein when the multiplexing circuitry connects a first one of the memory banks to the local memory controller, the multiplexing circuitry isolates the first memory bank from the interface to the external memory controller, and
the multiplexing circuitry is to connect a second one of the memory banks to the external memory controller via the external interface and the memory bus while connecting the first memory bank to the local memory controller.

18. The system of claim 17, wherein the memory module is configurable to connect each of the memory banks to the external interface.

19. The system of claim 17, wherein the external interface is to determine whether the memory bus is idle before the multiplexing circuitry is allowed to switch a connection of the memory bank to the local memory controller.

* * * * *

UNITED STATES PATENT AND TRADEMARK OFFICE
CERTIFICATE OF CORRECTION

| | | |
|---|---|---|
| PATENT NO. | : 9,064,562 B2 | Page 1 of 1 |
| APPLICATION NO. | : 13/856013 | |
| DATED | : June 23, 2015 | |
| INVENTOR(S) | : Raghavan V. Venugopal et al. | |

It is certified that error appears in the above-identified patent and that said Letters Patent is hereby corrected as shown below:

In the Drawings

In sheet 3 of 3, reference numeral 304, line 2, delete "CONTROLER" and insert -- CONTROLLER --, therefor.

Signed and Sealed this
Third Day of November, 2015

Michelle K. Lee
*Director of the United States Patent and Trademark Office*